United States Patent
Sun et al.

(10) Patent No.: US 11,450,770 B2
(45) Date of Patent: *Sep. 20, 2022

(54) STRUCTURES AND METHODS FOR REDUCING STRESS IN THREE-DIMENSIONAL MEMORY DEVICE

(71) Applicant: Yangtze Memory Technologies Co., Ltd., Hubei (CN)

(72) Inventors: Jian Hua Sun, Hubei (CN); Sizhe Li, Hubei (CN); Ji Xia, Hubei (CN); Qinxiang Wei, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/086,820

(22) Filed: Nov. 2, 2020

(65) Prior Publication Data

US 2021/0050446 A1 Feb. 18, 2021

Related U.S. Application Data

(63) Continuation of application No. 16/410,758, filed on May 13, 2019, now Pat. No. 10,825,929, which is a
(Continued)

(51) Int. Cl.
*H01L 29/78* (2006.01)
*H01L 23/00* (2006.01)
(Continued)

(52) U.S. Cl.
CPC ...... *H01L 29/7842* (2013.01); *G11C 16/0441* (2013.01); *G11C 16/0466* (2013.01);
(Continued)

(58) Field of Classification Search
CPC ........... H01L 29/7842; H01L 27/11582; H01L 27/11556; H01L 23/562; G11C 16/0466; G11C 16/0441
(Continued)

(56) References Cited

U.S. PATENT DOCUMENTS

| 5,915,167 A | 6/1999 | Leedy |
| 9,548,316 B2 | 1/2017 | Lim et al. |

(Continued)

FOREIGN PATENT DOCUMENTS

| CN | 102420172 A | 4/2012 |
| CN | 103078028 A | 5/2013 |
| CN | 108538845 A | 9/2018 |

OTHER PUBLICATIONS

International Search Report and Written Opinion of the International Searching Authority directed to related International Patent Application No. PCT/CN2019/071190, dated Oct. 9, 2019; 10 pages.

*Primary Examiner* — Vu A Vu
(74) *Attorney, Agent, or Firm* — Sterne, Kessler, Goldstein & Fox P.L.L.C.

(57) ABSTRACT

Embodiments of counter-stress structures and methods for forming the same are disclosed. The present disclosure describes a semiconductor wafer including a substrate having a dielectric layer formed thereon and a device region in the dielectric layer. The device region includes at least one semiconductor device. The semiconductor wafer further includes a sacrificial region adjacent to the device region, wherein the sacrificial region includes at least one counter-stress structure configured to counteract wafer stress formed in the device region.

20 Claims, 10 Drawing Sheets

Related U.S. Application Data continuation of application No. PCT/CN2019/071190, filed on Jan. 10, 2019.

(51) Int. Cl.
    *G11C 16/04*     (2006.01)
    *H01L 27/11556*     (2017.01)
    *H01L 27/11582*     (2017.01)

(52) U.S. Cl.
    CPC ...... *H01L 23/562* (2013.01); *H01L 27/11556* (2013.01); *H01L 27/11582* (2013.01)

(58) Field of Classification Search
    USPC .......................................................... 257/330
    See application file for complete search history.

(56) References Cited

U.S. PATENT DOCUMENTS

| | | |
|---|---|---|
| 9,698,303 B2 * | 7/2017 | Chiu .................. H01L 33/22 |
| 9,711,515 B1 | 7/2017 | Sonehara et al. |
| 10,825,929 B2 * | 11/2020 | Sun .................. H01L 23/585 |
| 2006/0043534 A1 * | 3/2006 | Kirby ................ H01L 21/02351 |
| | | 257/618 |
| 2008/0036012 A1 | 2/2008 | Yang et al. |
| 2008/0132058 A1 | 6/2008 | Yang et al. |
| 2010/0320509 A1 | 12/2010 | Knorr et al. |
| 2014/0042597 A1 | 2/2014 | Nelle et al. |
| 2017/0358593 A1 | 12/2017 | Yu et al. |
| 2018/0254284 A1 | 9/2018 | Hwang et al. |
| 2018/0269225 A1 | 9/2018 | Huang et al. |
| 2020/0227555 A1 | 7/2020 | Sun et al. |

* cited by examiner

STRUCTURES AND METHODS FOR REDUCING STRESS IN THREE-DIMENSIONAL MEMORY DEVICE

CROSS-REFERENCE TO RELATED APPLICATIONS

This application is a continuation of U.S. patent application Ser. No. 16/410,758, filed on May 13, 2019, titled "Structures and Methods for Reducing Stress in Three-dimensional Memory Device," which claims priority to PCT Patent Application No. PCT/CN2019/071190 filed on Jan. 10, 2019, all of which are incorporated herein by reference in their entireties.

TECHNICAL FIELD

The present disclosure generally relates to the field of semiconductor technology, and more particularly, to a method for reducing stress in semiconductor wafers for forming a three-dimensional (3D) memory device.

BACKGROUND

Planar memory cells are scaled to smaller sizes by improving process technology, circuit designs, programming algorithms, and fabrication processes. However, as feature sizes of the memory cells approach a lower limit, planar processes and fabrication techniques become challenging and costly. As such, memory density for planar memory cells approaches an upper limit. A three-dimensional (3D) memory architecture can address the density limitation in planar memory cells.

BRIEF SUMMARY

Embodiments of three-dimensional (3D) NAND memory devices having counter-stress structures and methods for forming the same are described in the present disclosure.

In some embodiments, a semiconductor wafer includes a substrate having a dielectric layer formed thereon and a device region in the dielectric layer. The device region includes at least one semiconductor device. The semiconductor wafer further includes a sacrificial region adjacent to the device region, wherein the sacrificial region includes at least one counter-stress structure configured to counteract wafer stress formed in the device region.

In some embodiments, a semiconductor wafer includes an array of dies, where each die of the array of dies has a first type of wafer stress. The semiconductor wafer also includes sacrificial regions between adjacent dies of the array of dies and a plurality of semiconductor structures formed in the sacrificial regions. Each semiconductor structure includes high-stress material configured to produce a second type of wafer stress to counteract the first type of wafer stress.

In some embodiments, a method for forming a semiconductor wafer, includes forming a dielectric layer on a substrate and forming a plurality of semiconductor structures in a device region of the semiconductor wafer. The plurality of semiconductor structures produce a first type of wafer stress in the semiconductor wafer. The method also includes forming a first plurality of openings in the dielectric layer and in the device region. The method further includes forming a second plurality of openings in the dielectric layer and in a sacrificial region that is adjacent to the device region. The method further includes disposing high-stress material in the first and second pluralities of openings, where the disposed high-stress material produces a second type of wafer stress in the semiconductor wafer to counteract the first type of wafer stress.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
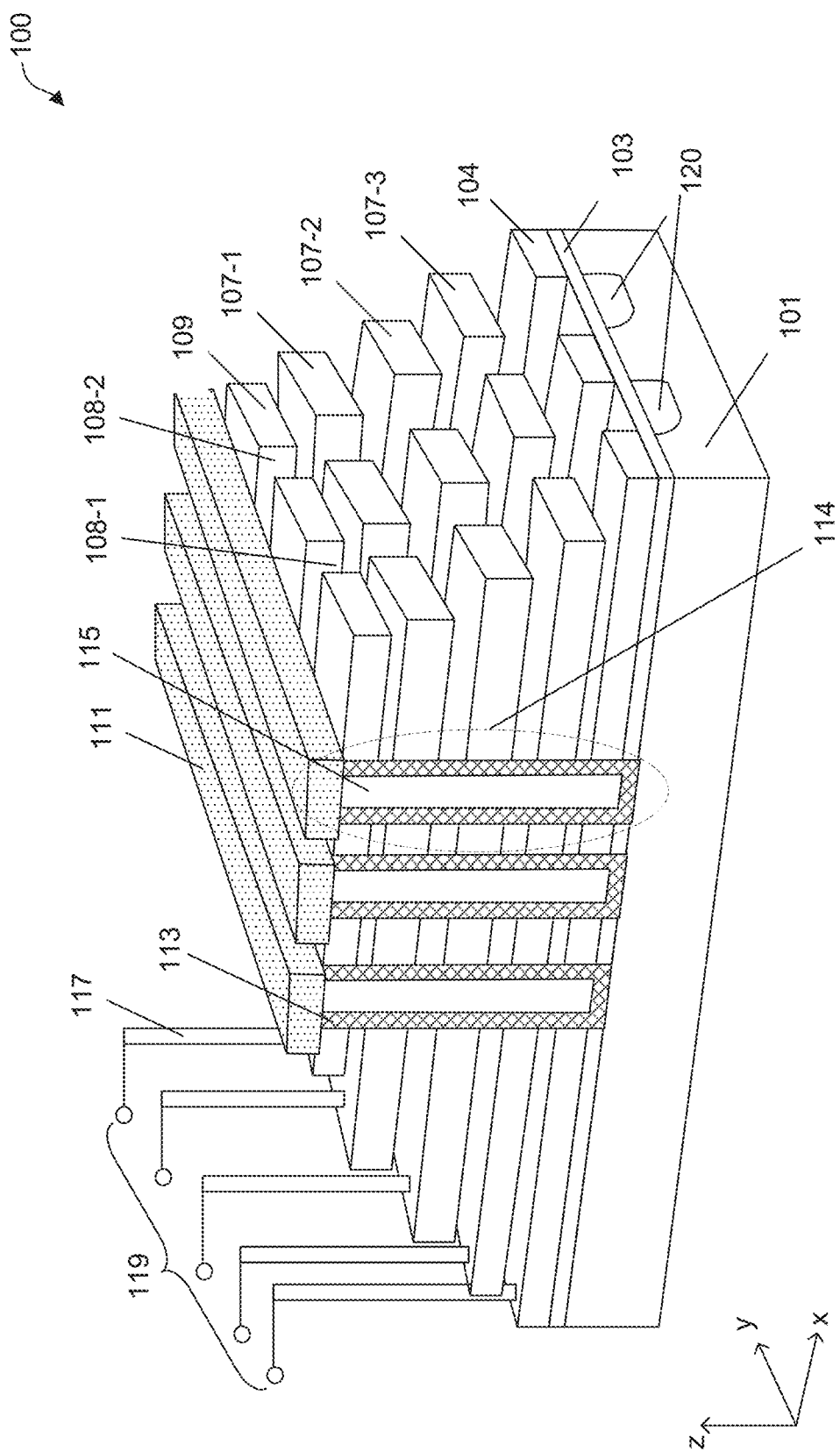
FIG. 1 illustrates a 3D NAND memory structure, in accordance with some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

In some embodiments, a NAND string or a 3D memory device includes a semiconductor pillar (e.g., silicon pillar) that extends vertically through a plurality conductor/dielectric layer pairs. The plurality of conductor/dielectric layer pairs are also referred to herein as an "alternating conductor/dielectric stack." The conductor layer of the alternating conductor/dielectric stack can be used as a word line (electrically connecting one or more control gates). An intersection of a word line and the semiconductor pillar forms a memory cell. Vertically-oriented memory strings require an electrical connection between the conductors materials (e.g., word line plates or control gates) and access lines (e.g., back end of line interconnection) so that each of the memory cells along the memory strings or in the 3D memory device can be uniquely selected for writing or reading functions. One method of forming electrical connections includes forming a staircase structure on an alternating conductor/dielectric stack. The staircase structure can be formed by repetitively etching the conductor/dielectric layer stack using a mask layer formed over the dielectric stack layer, where each layer stack is also referred to as a "staircase layer" (or "SC layer") of the staircase structure in the present disclosure. A dielectric layer is disposed on the staircase structure and openings are formed in the dielectric layer to expose each staircase layer. Electrical connections such as vias or lead wires are formed by disposing conductive material in the openings and connecting to the conductive layer on each level of the staircase structure. Electrical connections are also formed to connect peripheral circuitry to other device/structures. Other layers and structures such as metal layers and vias are formed on the staircase structure and peripheral circuitry.

Thin film deposition, photolithography, etching processes are used to form various structures in semiconductor structures, such as disposing dielectric layers and forming interconnect structures. For example, in a 3D NAND memory device, an alternating conductor/dielectric layer stack can be fabricated by alternatingly disposing dielectric layers and replacing a selection of the disposed dielectric layers with conductive layers. However, when thin films having different coefficient of thermal expansion (CTE) are stacked together, mismatch between thermal expansion coefficients can lead to undesirable wafer stress. For example, thin films can be disposed using physical vapor deposition (PVD) processes that are performed at a temperature above room temperature, and the disposed thin films having mismatched CTEs contract at different speeds after wafers are cooled down to room temperature. The variation of temperature causes stress in the disposed thin films. In addition, intrinsic stress in thin films can arise due to several processes during thin film deposition, for example, grain growth, grain boundary relaxation, shrinkage of grain boundary voids, phase transformations and precipitation, vacancy annihilation, and other processes. These processes produce forces exerted onto the semiconductor structure and cause the semiconductor structure to "expand" or "shrink", depending on the direction of the force acting on the material, which respectively results in tensile or compressive stress. Therefore, compressive stress and tensile stress are opposite types of wafer stress. In order to accommodate these additional stress effects and reach a stable state, the film stack would bow itself up or down, depending whether the resultant stress is compressive or tensile. However, wafer bowing or warpage is undesirable in semiconductor processing because a non-planar surface can lead to non-uniform processing which in turn significantly reduces product yield.

As the demand for higher storage capacity continues to increase, the number of vertical levels of the memory cells and staircase structures also increases. A semiconductor device having a large number of vertical levels, such as a 32-level or 64-level 3D NAND memory device, may experience wafer bowing and warpage that reduces product yield. Low stress material can be used in semiconductor devices but selection of the low stress material is limited and often associated with complex processes and high cost. Alternatively, annealing processes can reduce wafer stress but is often limited by thermal budgets of the devices. Accordingly, it is challenging to balance the manufacturing throughput and the process complexity/cost.

To address the above shortcomings, embodiments described herein are directed to counter-stress structures for a 3D NAND memory device and fabricating methods of the same. In some embodiments, the counter-stress structures can be semiconductor structures that are located in sacrificial regions of a semiconductor wafer that act to counteract other stresses, such as stresses that may form in adjacent device regions. For example, the semiconductor structures can be trenches filled with high-stress material and formed in scribe lines between adjacent device regions. The counter-stress structures can reduce overall stress of the semiconductor wafer by configuring the high-stress material in sacrificial regions to generate stress that is the opposite type of stress generated in the device regions. In some embodiments, the counter-stress structures can be formed along the x-direction or the y-direction in plan view. In some embodiments, the dimensions and density of counter-stress structures can be determined by the stress level of the semiconductor wafer.

The exemplary fabrication method for forming counter-stress structures includes forming openings in sacrificial regions of a semiconductor wafer containing an array of 3D NAND memory devices. In some embodiments, the sacrificial regions can be regions where no device is formed. In some embodiments, sacrificial regions can be within a die. For example, sacrificial regions can be a region within a die that no device is formed. High stress material is disposed in the openings and used to counter the stress formed by other structures on the semiconductor wafer. In some embodiments, forming the openings and depositing high stress material can be performed concurrently with forming openings for peripheral circuitry and disposing conductive material in the peripheral circuit openings, respectively, which in turn provides the benefit of no additional masks or processes steps needed.

Various counter-stress structures described in the present disclosure can provide benefits such as, among other things, reduced overall stress in 3D NAND memory devices without occupying device space, no additional masks or processing steps needed, and wide range of suitable high-stress materials. Therefore, counter-stress structures can reduce stress in semiconductor wafers, which in turn ensures and improves the performance and yield of the 3D NAND memory devices.

Before describing contact pads in 3D NAND memory devices in detail, an exemplary 3D NAND flash memory device is illustrated in FIG. 1. The flash memory device includes a substrate 101, an insulating layer 103 over substrate 101, a tier of bottom select gate electrodes 104 over insulating layer 103, and a plurality of tiers of control gate electrodes 107 (e.g., 107-1, 107-2, and 107-3) stacking on top of bottom select gate electrodes 104. Flash memory device 100 also includes a tier of top select gate electrodes 109 over the stack of control gate electrodes 107, doped source line regions 120 in portions of substrate 101 between adjacent bottom select gate electrodes 104, and semiconductor channels 114 through top select gate electrodes 109, control gate electrodes 107, bottom select gate electrodes 104, and insulating layer 103. Semiconductor channel 114 (illustrated by a dashed eclipse) includes a memory film 113 over the inner surface of semiconductor channel 114 and a core filling film 115 surrounded by memory film 113 in semiconductor channel 114. The flash memory device 100 further includes a plurality of bitlines 111 disposed on and connected to semiconductor channels 114 over top select gate electrodes 109. A plurality of metal interconnects 119 are connected to the gate electrodes (e.g., 104, 107, and 109) through a plurality of metal contacts 117. During device fabrication, metal interconnects 119 are aligned and connected to metal contacts 117. In some embodiments, metal contacts 117 can be vias formed in insulating layers that are formed between adjacent tiers of gate electrodes. Insulating layers are not shown in FIG. 1 for simplicity. The gate electrodes can also be referred to as the word lines, which include top select gate electrodes 109, control gate electrodes 107, and bottom select gate electrodes 104.

In FIG. 1, for illustrative purposes, three tiers of control gate electrodes 107-1, 107-2, and 107-3 are shown together with one tier of top select gate electrodes 109 and one tier of bottom select gate electrodes 104. Each tier of gate electrodes have substantially the same height over substrate 101. The gate electrodes of each tier are separated by gate line slits 108-1 and 108-2 through the stack of gate electrodes. Each of the gate electrodes in a same tier is conductively connected to a metal interconnect 119 through a metal contact 117. That is, the number of metal contacts formed on the gate electrodes equals the number of gate electrodes (i.e., the sum of all top select gate electrodes 109, control gate electrodes 107, and bottom select gate electrodes 104). Further, the same number of metal interconnects is formed to connect to each metal contact 117.

For illustrative purposes, similar or same parts in a 3D NAND memory device are labeled using same element numbers. However, element numbers are merely used to distinguish relevant parts in the Detailed Description and do not indicate any similarity or difference in functionalities, compositions, or locations. Although using a 3D NAND device as an example, in various applications and designs, the disclosed structure can also be applied in similar or different semiconductor devices to, e.g., reduce the leakage current between adjacent word lines. The specific application of the disclosed structure should not be limited by the embodiments of the present disclosure. For illustrative purposes, word lines and gate electrodes are used interchangeably to describe the present disclosure. In various embodiments, the number of layers, the methods to form these layers, and the specific order to form these layers may vary according to different designs and should not be limited by the embodiments of the present disclosure. It should be noted that the x-direction and y-direction illustrated in these figures are for clarity purposes and should not be limiting.

Exemplary configuration and fabrication processes of counter-stress structures including trenches filled with high-stress material are described further in detail below with reference to FIGS. 2-11. Exemplary structures and fabrication processes shown in FIGS. 2-11 can be directed to forming 3D NAND memory devices. The 3D NAND memory devices can include word line staircase regions and counter-stress trenches extending in any suitable direction such as, for example, positive y-direction, negative y-direction, positive x-direction, negative x-direction, and/or any suitable directions.

Figure 2:
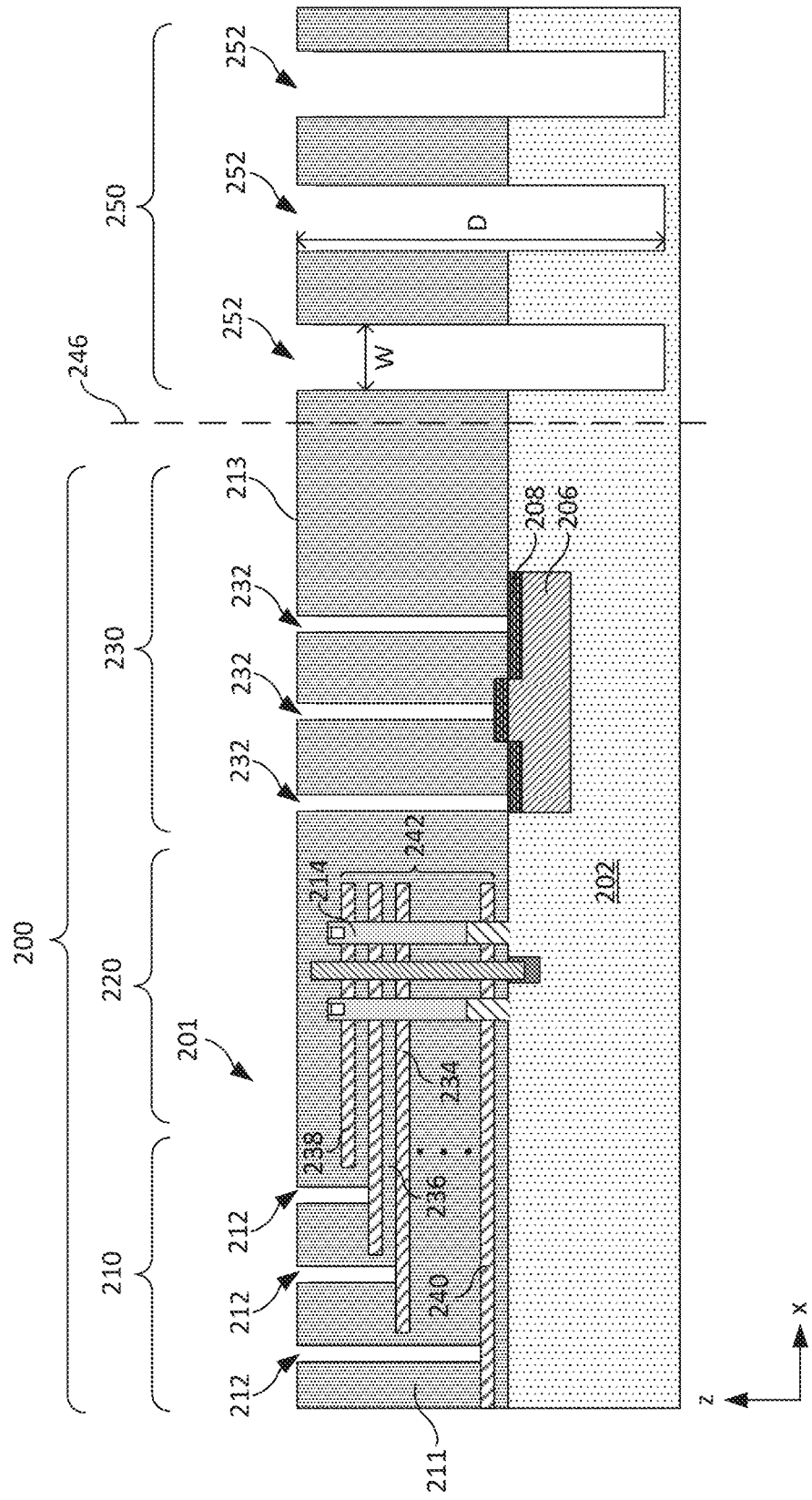
FIGS. 2-5 are cross-sectional views that illustrate exemplary fabrication processes for forming counter-stress structures in sacrificial regions of a semiconductor wafer, in accordance with some embodiments of the present disclosure.

FIG. 2 illustrates a cross-sectional view of a portion of a semiconductor wafer that includes 3D NAND memory structures and openings for forming counter-stress structures, according to some embodiments. Semiconductor wafer includes a substrate 202 and a dielectric layer 211. Dielectric layer 211 includes a top surface 213 that is substantially planar. 3D NAND memory structure 201 is formed in a device region 200 of the semiconductor wafer and trenches 252 are formed in a sacrificial region 250 of the semiconductor wafer. Merely for ease of description, device region 200 and sacrificial region 250 are separated by boundary 246. In addition, for ease of description, device region 200 that includes 3D NAND memory structure 201 can be divided into three regions: staircase region 210, active device region 220, and peripheral device region 230. In some embodiments, device region 200 and sacrificial region 250 can both be within a boundary of a semiconductor die. In some embodiments, device region 200 can be within a boundary of a semiconductor die while sacrificial region 250 can be outside of the die boundary.

Substrate 202 can include any suitable material for forming a 3D NAND memory structure. In some embodiments, substrate 202 can include silicon, silicon germanium, silicon carbide, silicon on insulator (SOI), germanium on insulator (GOI), glass, gallium nitride, gallium arsenide, any suitable III-V compound material, and/or combinations thereof. Dielectric layer 211 can be formed using any suitable dielectric material such as, for example, silicon oxide, silicon nitride, silicon oxynitride, and/or other suitable dielectric materials. The deposition of dielectric layer 211 can include any suitable methods such as chemical vapor deposition (CVD), physical vapor deposition (PVD), plasma-enhanced CVD (PECVD), sputtering, metal-organic chemical vapor deposition (MOCVD), atomic layer deposition (ALD), and/or combinations thereof. Dielectric layer 211 can include one or more etch stop layers and are not illustrated for ease of description.

A plurality of conductor layer 234 and dielectric layer 236 pairs are formed in staircase region 210 and active device region 220. Active device region 220 can include functional semiconductor devices that are commonly referred to as "active devices." For example, active devices can include transistors, diodes, and/or any suitable semiconductor devices. It is not required that an active device need to actually be operating, but that it is one of a class of "active devices" capable of being operated (e.g., can be turned on and off). The plurality of conductor/dielectric layer pairs are also referred to herein as an alternating conductor/dielectric stack 242. Conductor layers 234 and dielectric layers 236 in alternating conductor/dielectric stack 242 alternate in the vertical direction. In other words, except the ones at the top or bottom of alternating conductor/dielectric stack 242, each conductor layer 234 can be adjoined by two dielectric layers 236 on both sides, and each dielectric layer 236 can be adjoined by two conductor layers 234 on both sides. Conductor layers 234 can each have the same thickness or have different thicknesses. Similarly, dielectric layers 236 can each have the same thickness or have different thicknesses. In some embodiments, alternating conductor/dielectric stack 242 includes more conductor layers or more dielectric layers with different materials and/or thicknesses than the conductor/dielectric layer pair. Conductor layers 234 can include conductor materials including, but not limited to, W, Co, Cu, Al, doped silicon, silicides, or any combination thereof. Dielectric layers 236 can include dielectric materials including, but not limited to, silicon oxide, silicon nitride, silicon oxynitride, or any combination thereof.

3D NAND memory structure 201 further includes NAND strings 214 formed in active device region 220 and include a plurality of control gates (each being part of a word line). Each conductor layer 234 in alternating conductor/dielectric stack 242 can act as a control gate for each memory cell of NAND string 214. Further, NAND strings 214 can include a select gate 238 (e.g., a drain select gate) at an upper end and another select gate 240 (e.g., a source select gate) at a lower end. As used herein, the "upper end" of a component (e.g., NAND string 214) is the end further away from substrate 202 in the z-direction, and the "lower end" of the component (e.g., NAND string 214) is the end closer to substrate 202 in the z-direction. In some embodiments, select gates 238 and 240 can include conductor materials including, but not limited to, W, Co, Cu, μl, doped silicon, silicides, or any combination thereof.

A peripheral device region 230 can be formed adjacent to active device region 220. Peripheral device region 230 can include a plurality of peripheral devices 206 formed on substrate 202, in which the entirety or part of the peripheral device is formed in substrate 202 (e.g., below the top surface of substrate 202) and/or directly on substrate 202. The peripheral devices 206 can include a plurality of transistors formed on substrate 202. Isolation regions and terminals 208 (e.g., a source region, a drain region, or a gate of the transistor) can be formed in substrate 202 as well.

In some embodiments, the peripheral device can include any suitable digital, analog, and/or mixed-signal peripheral circuits used for facilitating the operation of 3D NAND memory structure 201. For example, peripheral devices 206 can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). In some embodiments, the peripheral device is formed on substrate 202 using complementary metal-oxide-semiconductor (CMOS) technology (also known as a "CMOS chip").

3D NAND memory structure 201 further includes contact structures in staircase region 210, active device region 220, and peripheral device region 230. The contact structures are formed to provide electrical connections to devices embedded in substrate 202 and/or dielectric layer 211. For example, 3D NAND memory device includes one or more word line contacts in staircase region 210. Word line contacts can extend vertically within dielectric layer 211. Each word line contact can have an end (e.g., the lower end) in contact with a corresponding conductor layer 234 in alternating conductor/dielectric stack 242 to individually address a corresponding word line of the array device.

Peripheral interconnect structures can also be formed above peripheral devices 206 to transfer electrical signals to and from peripheral devices 206. Peripheral interconnect structures can include one or more contacts and conductor layers, each including one or more interconnect lines and/or vias. As used herein, the term "contact" can broadly include any suitable types of interconnects, such as middle-end-of-line (MEOL) interconnects and back-end-of-line (BEOL) interconnects, including vertical interconnect accesses (e.g., vias) and lateral lines (e.g., interconnect lines).

To form word line contacts and peripheral interconnect structures, openings are first formed in dielectric layer 211 to expose the corresponding word line of the array device and/or terminals 208 of peripheral devices 206. For example, openings 212 are formed in staircase region 210 through dielectric layer 211 to expose one or more conductor layers 234 of alternating conductor/dielectric stack 242.

Similarly, openings 232 are formed in peripheral device region 230 through dielectric layer 211 to expose terminals 208 of peripheral devices 206. Openings 212 and 232 can be formed in the same fabrication step (e.g., during the same patterning and etching processes) or respectively formed in different fabrication steps, according to some embodiments. Openings 252 are formed in sacrificial region 250 for forming counter-stress structures. One or more openings 252 can extend into dielectric layer 211, and in some embodiments, further extending into substrate 202. In some embodiments, openings 252 can have substantially the same depth or different depths. Width W and depth D of openings 252 can respectively determine the width and depth of subsequently formed counter-stress structures. In some embodiments, openings 252 can have a width W that is between about 0.1 μm and about 0.5 μm. In some embodiments, openings 252 can have a depth D that is between about 4 μm and about 10 μm.

Openings 212, 232, and 252 can be formed using one or more patterning and etching processes. In some embodiments, openings 252 are formed using patterning and etching processes that are the same as those used to form openings 212 and/or openings 232. Such arrangement provides the benefit of not requiring any additional photolithography masks or processing steps. In some embodiments, openings 252 are formed in different fabrication steps other than those used to form openings 212 or openings 232. In some embodiments, the patterning process can include forming a photoresist layer on dielectric layer 211, exposing the photoresist layer to a pattern, performing post-exposure bake processes, and developing the photoresist layer to form a masking element including the resist. The masking element can protect regions of dielectric layer 211, while one or more etch processes are used to form an opening in dielectric layer 211. The etching process can be a reactive ion etch (RIE) process, a wet etching process, and/or other suitable process. The etching process can continue until the underlying layer is exposed. For example, the etching process for forming openings 212 can continue until the conductor layers 234 are exposed. In some embodiments, the etching process for forming openings 232 can continue until the underlying terminals 208 are exposed. In some embodiments, the etching process for forming openings 252 can continue until the underlying substrate 202 is exposed. In some embodiments, openings 252 can be formed using a timed etching process where a nominal depth D of openings 252 is achieved by continuing the etching process for a specified time until a nominal depth D is reached.

Figure 3:
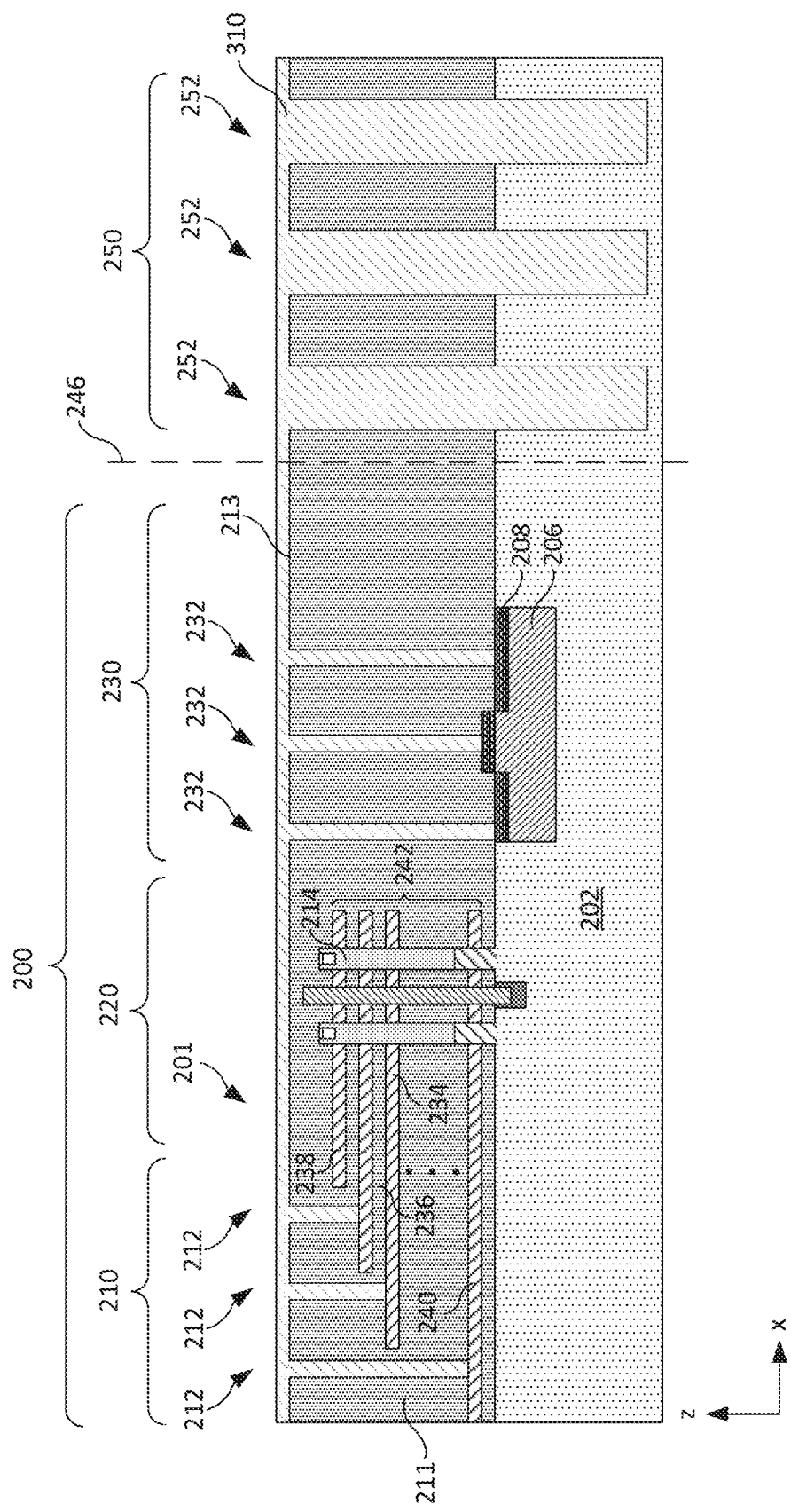

FIG. 3 illustrates a cross-sectional view of a portion of a semiconductor wafer after filling openings in device regions and sacrificial regions, in accordance with some embodiments of the present disclosure. As shown in FIG. 3, a layer of conductive material 310 is disposed on the semiconductor wafer. For example, high-stress material 310 is disposed in openings 212, 232, and 252. In some embodiments, high-stress material can be a material used to form deposited film having internal film stress greater than about 1 Gpa. In some embodiments, high-stress material 310 completely fills openings 212, 232, and 252 and overflows onto top surface 213 of dielectric layer 211, as illustrated in FIG. 3. In some embodiments, high-stress material 310 partially fills opening 252. In some embodiments, openings 252 can be filled using a separate deposition process other than the deposition process used to fill openings 212 or 232. High-stress material 310 can be any suitable high-stress material including, but not limited to, tungsten (W), cobalt (Co), copper (Cu), aluminum (Al), or any combination thereof. High-stress material 310 can be used to counter the stress formed in structures in the device regions of the semiconductor wafer such that the overall stress in the semiconductor wafer is reduced. For example, if compressive stress is detected in the semiconductor wafer due to structures such as 3D NAND memory structure 201 or peripheral devices 206, high-stress material 310 can be material that provides tensile stress when formed in openings 252 to counter the compressive stress and reduce the overall stress. Similarly, if tensile stress is detected in the semiconductor wafer due to structures such as 3D NAND memory structure 201 or peripheral devices 206, high-stress material 310 can be material that provides compressive stress when formed in openings 252 to counter the tensile stress and reduce the overall stress. High-stress material 310 can be a conductive material such that openings 212 and 232 filled with high-stress material 310 can also be used to provide electrical connection to the underlying conductive structures. Tungsten is an example of high-stress material that also provides exceptional electrical conductivity. Disposing conductive high-stress material in openings 212, 232, and 252 can provide the benefit of forming both the conductive structures in the device region and counter-stress structures in the sacrificial region using one fabrication step, without the need to use additional masks or deposition steps. In some embodiments, the high-stress material can be disposed using any suitable deposition method such as, for example, for example, CVD, PVD, PECVD, sputtering, MOCVD, ALD, and/or combinations thereof. In some embodiments, a conductive material disposed in openings of the device region can be different from a high-stress material disposed in openings in the sacrificial region for forming counter-stress structures, however, that would likely require more than one deposition step and additional masks for photolithography process. In some embodiments, high-stress material disposed in openings 252 can be formed using one or more materials including at least one high-stress material. For example, a first high-stress material can be disposed in openings 252 using any suitable deposition methods, and a second high-stress material can be disposed on the first high-stress material using any suitable deposition methods. In some embodiments, at least one of the first and second high-stress materials is a high-stress material such as, for example, tungsten. In some embodiments, other layers such as barrier layers, liners, can be disposed in the openings and are not illustrated for ease of description.

Figure 4:
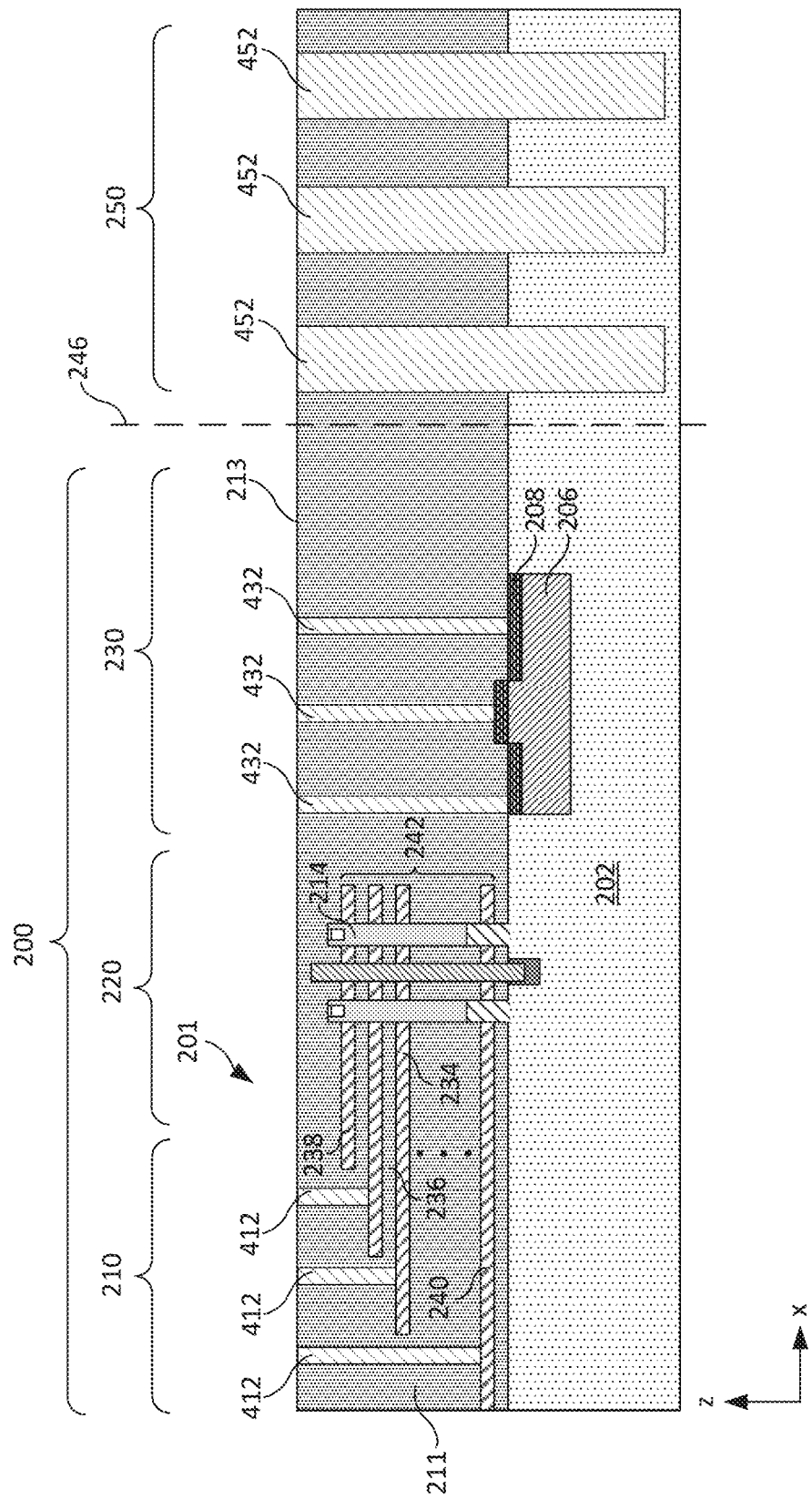

FIG. 4 illustrates a cross-sectional view of a portion of a semiconductor wafer after a planarization process is performed, in accordance with some embodiments of the present disclosure. A planarization process can be used to remove excessive high-stress material 310 from top surface 213 of dielectric layer 211 such that top surfaces of high-stress material 310 filled in openings 212, 232, and 252 are substantially level (e.g., coplanar) with top surface 213. In some embodiments, the planarization process can be a chemical mechanical polishing process. After the planarization process, conductive structures are formed in the openings of device region 200 and counter-stress structures are formed in sacrificial region 250. For example, conductive structures 412 are formed in openings 212 of staircase region 210. Similarly, conductive structures 432 are formed in openings 232 of peripheral device region 230. In some embodiments, conductive structures 412 can be contact wires and referred to as word line contacts. Counter-stress structures 452 can be formed in sacrificial region 250 after the planarization process. Although a plurality of counter-stress structures 452 are illustrated in FIG. 4, any suitable number of counter-stress structures can be used. In some embodiments, the suitable number of counter-stress structures depends on the stress that is accumulated in the semiconductor wafer due to semiconductor structures such as 3D NAND memory structure 201. In some embodiments, a greater amount of counter-stress material can be used to reduce a greater amount of stress. The greater amount of counter-stress material disposed can be achieved through forming a greater number of counter-stress structures. In some embodiments, the greater amount of counter-stress material disposed can be achieved through forming counter-stress structures with greater width W and/or depth D, as permitted by fabrication limitations.

Figure 5:
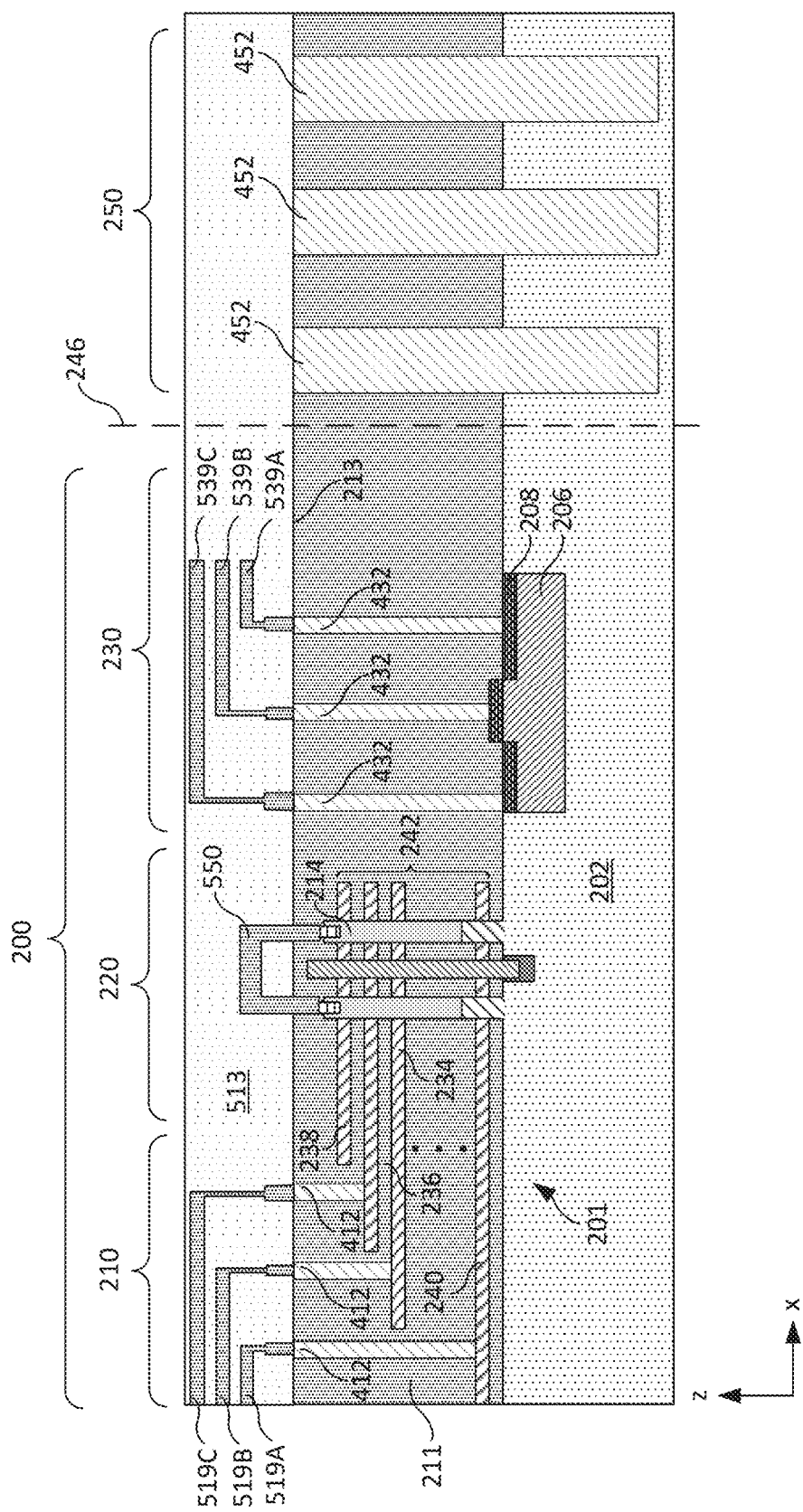

FIG. 5 illustrates a semiconductor wafer after lead wires are formed and electrically connected to various conductive structures, in accordance to some embodiments of the present disclosure. As shown in FIG. 5, a dielectric layer 513 is disposed on planarized top surface 213 of dielectric layer 211 and on top surfaces of conductive structures 412 and 432. In some embodiments, dielectric layer 513 is also disposed on top surfaces of counter-stress structures 452. Dielectric layer 513 can be formed using any suitable dielectric material such as, for example, silicon oxide, silicon nitride, silicon oxynitride, and/or other suitable dielectric materials. The deposition of dielectric layer 513 can include any suitable methods such as CVD, PVD, PECVD, sputtering, MOCVD, ALD, and/or combinations thereof. Dielectric layer 513 can include one or more etch stop layers and are not illustrated for ease of description.

Lead wires 519A-519C are formed in staircase region 210, lead wire 550 is formed in active device region 220, and lead wires 539A-539C are formed in peripheral device region 230, in accordance to some embodiments. Each of the lead wires 519A-519C and 539A-539C can be electrically connected to conductive structures 412 and 432, respectively. Lead wires 519A-519C and 539A-539C can be formed using any suitable deposition, patterning, and etching processes. In some embodiments, lead wires 519A-519C and 539A-539C can be formed using any suitable material such as, for example, tungsten, copper, silver, aluminum, cobalt, and/or combinations thereof. As shown in FIG. 5, lead wires 519A-519C can be aligned with underlying conductive structures 412 and lead wires 539A-539C can be aligned with underlying conductive structures 432 to provide electrical connectivity.

Figure 6:
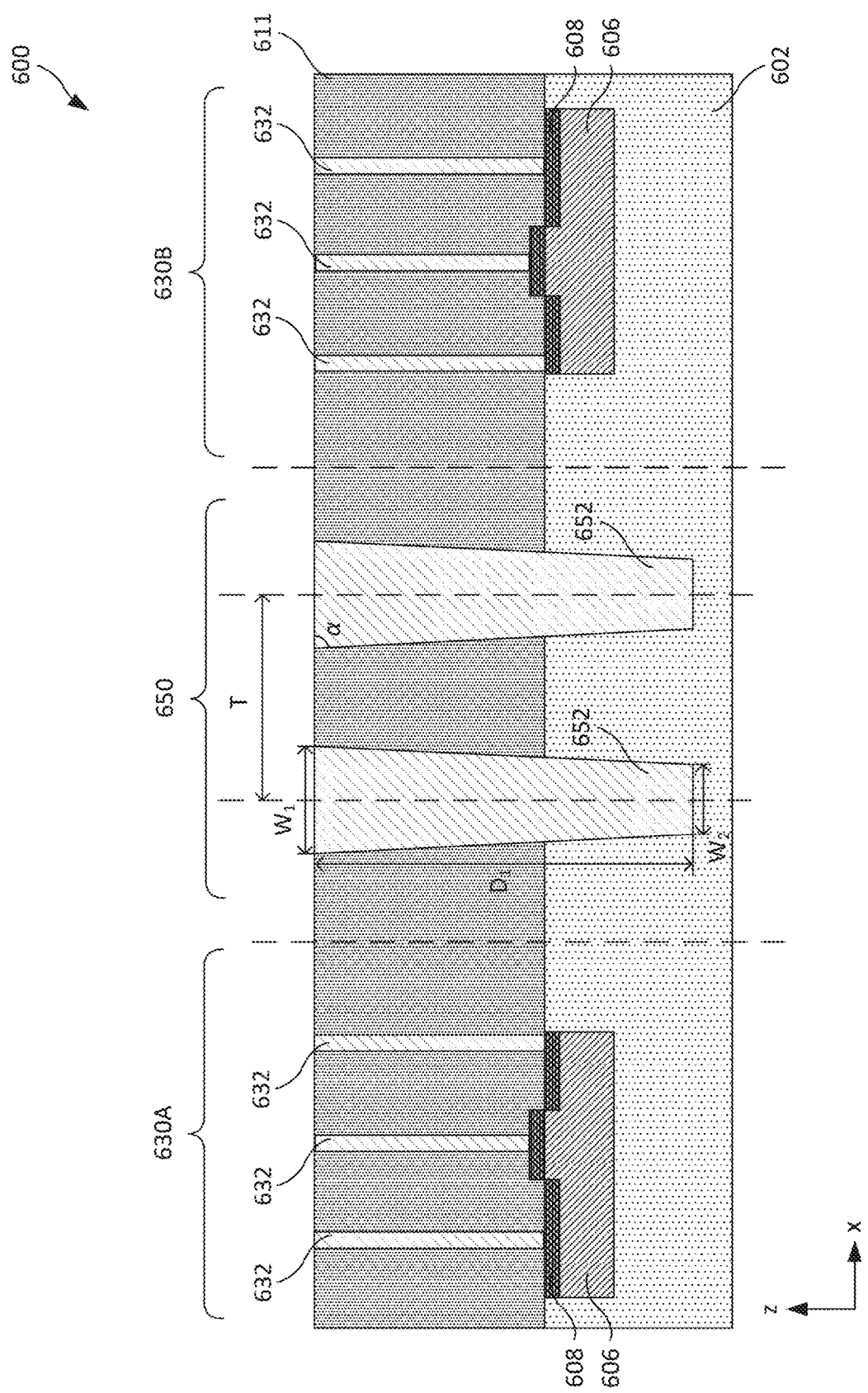
FIGS. 6-7 are cross-sectional views that illustrate exemplary counter-stress structures on a semiconductor wafer, in accordance with some embodiments of the present disclosure.
Figure 7:
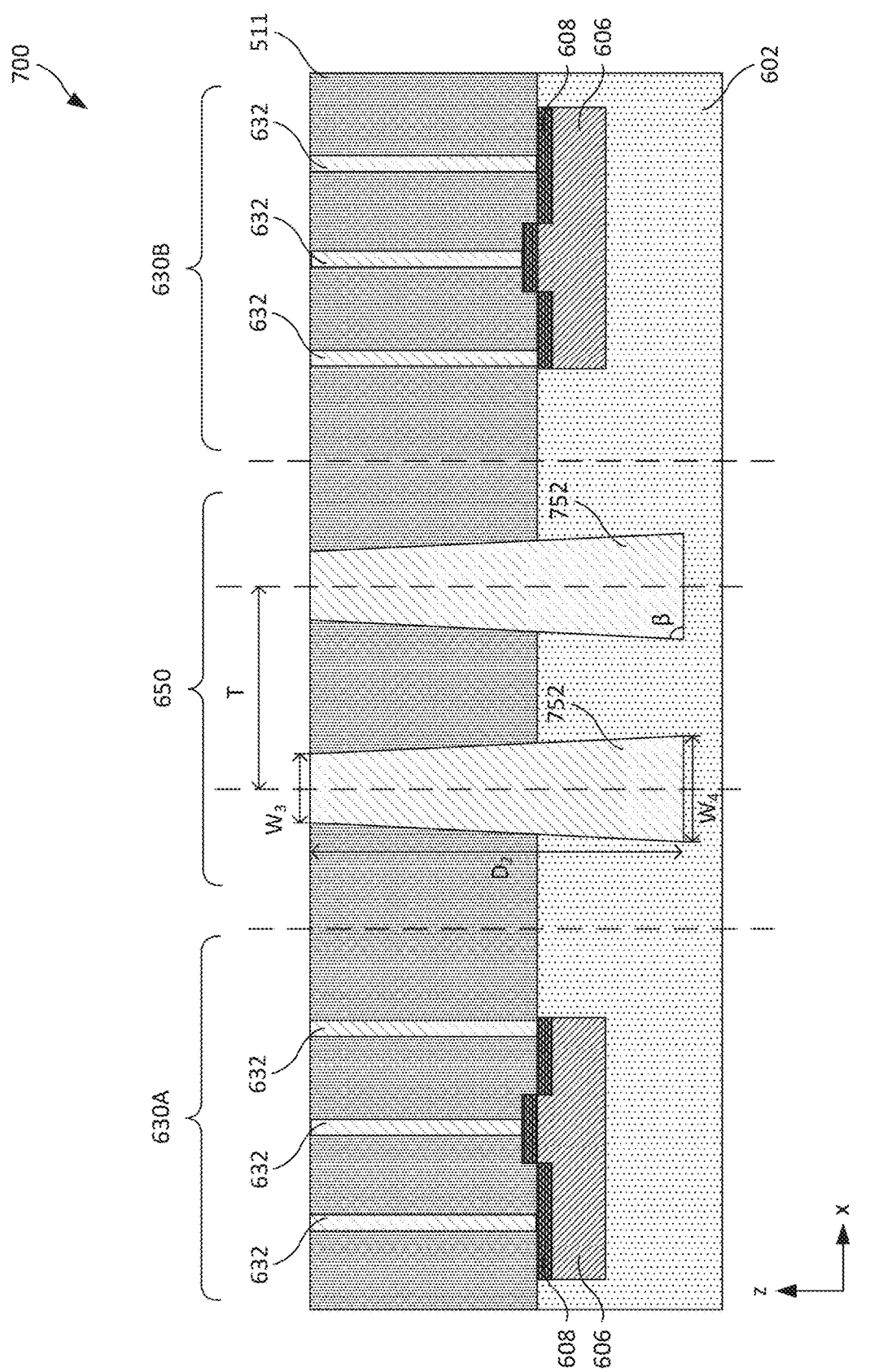

FIGS. 6-7 are cross-sectional views of portions of a semiconductor wafer including peripheral structures and various counter-stress structures, according to some embodiments. FIGS. 6-7 respectively illustrate portions of semiconductor wafers 600 and 700 that includes substrate 602, dielectric layer 611, a plurality of peripheral devices 606 formed in peripheral device regions 630A and 630B, counter-stress trenches 652 and 752 formed in sacrificial region 650 that is between the peripheral device regions 630A and 630B. Peripheral devices 606 can include a plurality of transistors in substrate 602. Isolation regions and terminals 608 can be formed in substrate 602 as well. Conductive structures 632 can be formed in dielectric layer 611 that provide electrical connection to structures formed in peripheral device regions 630A and 630B. Peripheral devices 606, terminals 608, and conductive structures 632 can be respectively similar to peripheral devices 206, terminals 208, and conductive structures 432 described above in FIG. 5 and are not described in detail here for simplicity. Sacrificial region 650 is formed between adjacent peripheral device regions 630A and 630B. In some embodiments, adjacent peripheral device regions 630A and 630B can be portions of adjacent dies, respectively, and sacrificial region 650 is formed between the adjacent dies. In some embodiments, portions of sacrificial region 650 can be portions of adjacent dies. In some embodiments, the adjacent dies can include other structures such as 3D NAND memory devices in a device region. In some embodiments, sacrificial region 650 can be a scribe line on wafer 600 or 700. Scribe lines are spaces between dies on a semiconductor wafer where a precision dicing saw can cut through to safely separate the dies. Therefore, no devices are formed in the scribe line region because the scribe line would be sacrificed during the dicing process. Counter-stress structures formed in the scribe line can utilize the sacrificial scribe line region and reduce overall wafer stress. For example, counter-stress structures 652 and 752 respectively illustrated in FIGS. 6-7 can be formed using high-stress material that reduces wafer stress. The disposed high-stress material can provide compressive or tensile stress for respectively reducing tensile or compressive stress in wafers 600 or 700.

The cross-sectional shapes and numbers of counter-stress structures can be determined by the amount of stress accumulated in the semiconductor wafers. For example, a single counter-stress structure can be formed in each scribe line. In some embodiments, two counter-stress structures can be formed in each scribe line, as illustrated in FIGS. 6-7. In some embodiments, any suitable number of counter-stress structures can be used. Counter-stress structures can also have any suitable cross-sectional shape. For example, cross-sectional shape of counter-stress 652 illustrated in FIG. 6 can have a trapezoidal shape with top width $W_1$ measured at the top of counter-stress structure 652 and bottom width $W_2$ measured at the bottom of counter-stress structure 652. As illustrated in FIG. 6, counter-stress structure 652 can have a greater width at the top than at the bottom of the structure, and such configuration can provide the benefit of providing greater reduced stress towards the top of dielectric layer 611. In some embodiments, width $W_1$ can be in a range between about 0.1 μm and about 0.5 μm. In some embodiments, width $W_2$ can be in a range between about 0.05 μm and about 0.25 μm. In some embodiments, a top-to-bottom ratio $R_1$ of $W_1$ over $W_2$ can be between about 1.5 and about 2.5. For example, $R_1$ can be about 2. In some embodiments, a depth $D_1$ of counter-stress structures 652 can be in a range between about 4 μm and about 10 μm. In some embodiments, an angle α between top surface and sidewall surfaces of counter-stress structure 652 can be in a range between about 90° and about 45°. As illustrated in FIG. 7, counter-stress structure 752 can have a greater width at the bottom than at the top of the structure, and such configuration can provide the benefit of providing greater stress towards the bottom of dielectric layer 611 or substrate 602. In some embodiments, width $W_3$ at the top of counter-stress structures 752 can be in a range between about 0.05 μm and about 0.25 μm. In some embodiments, width $W_4$ at the bottom of counter-stress structures 752 can be in a range between about 0.1 μm and about 0.5 μm. In some embodiments, a top-to-bottom ratio $R_2$ of $W_3$ over $W_4$ can be between about 0.4 and about 0.7. For example, $R_2$ can be about 0.5. In some embodiments, a depth $D_2$ of counter-stress structures 752 can be in a range between about 4 μm and about 10 μm. In some embodiments, an angle β between bottom surface and sidewall surfaces of counter-stress structure 652 can be in a range between about 90° and about 45°.

Figure 8:
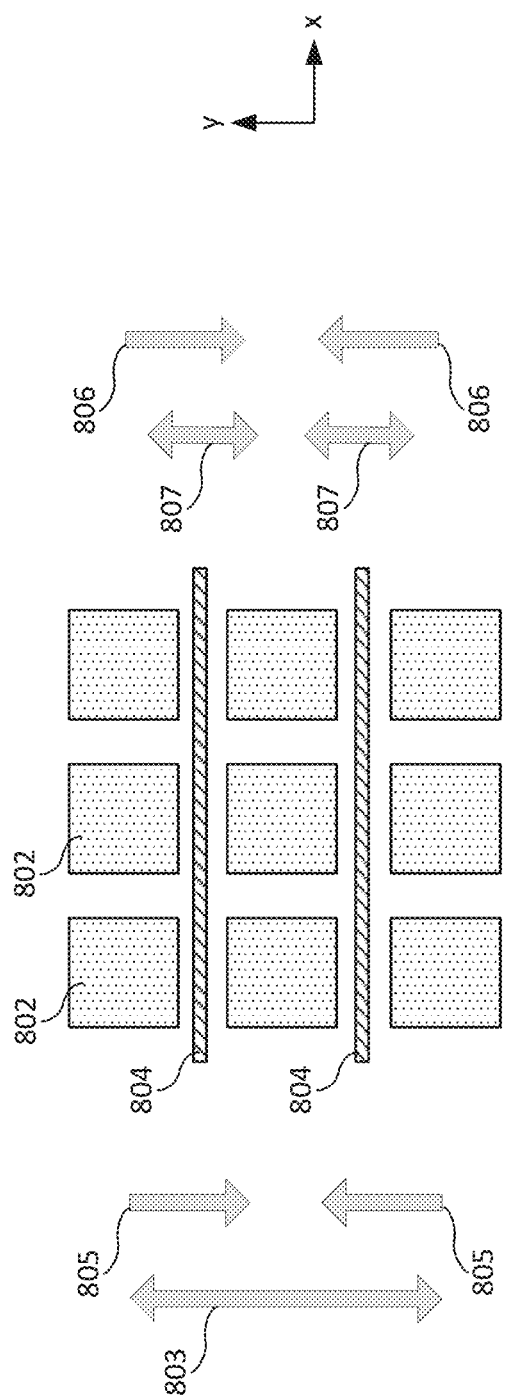
FIGS. 8-10 are plan views that illustrate exemplary counter-stress structures on a semiconductor wafer, in accordance with some embodiments of the present disclosure.
Figure 10:
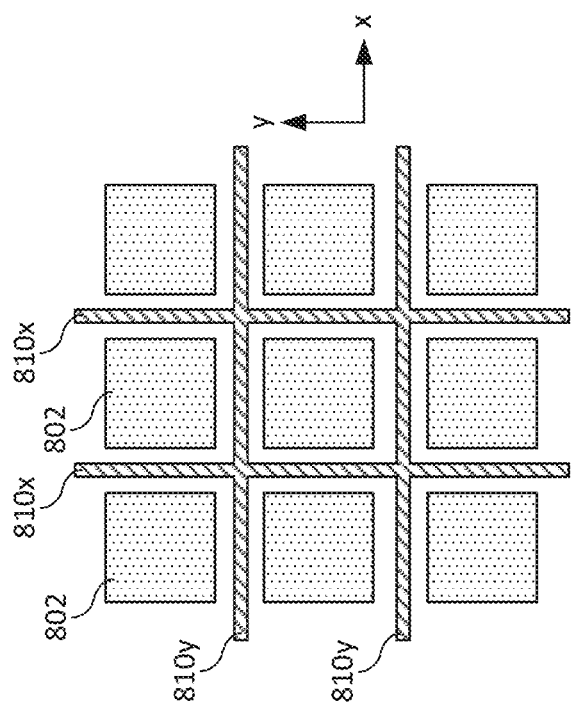
Figure 9:
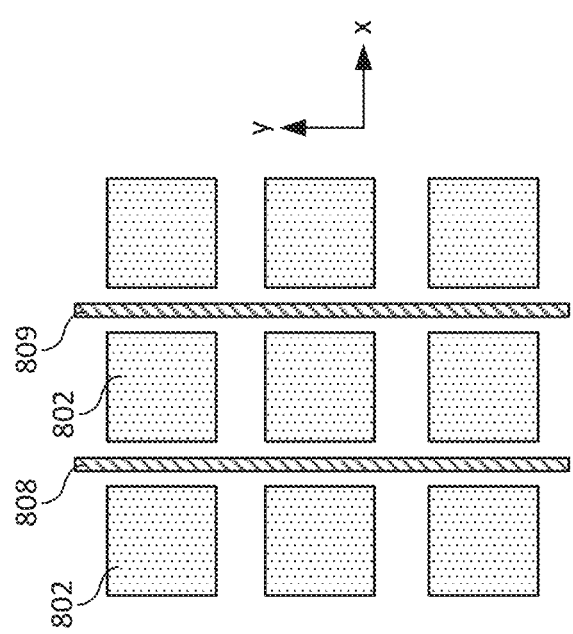

FIGS. 8-10 are plan views that illustrate dies and exemplary counter-stress structures on a semiconductor wafer, according to some embodiments. Counter-stress structures can be used to reduce wafer stress in any suitable horizontal directions such as, for example, in an x-direction, a y-direction, or both. FIGS. 8-10 include an array of dies 802 spaced equally from each other in the x-direction and y-direction. Dies 802 can include a plurality of device regions such as device region 200 illustrated in FIGS. 2-5. For example, dies 802 can include 3D NAND memory structures having staircase regions and active device regions. Dies 802 can also include peripheral device regions. The staircase regions, active device regions, peripheral device regions, and other suitable structures are not illustrated in FIGS. 8-10 for simplicity. The regions between dies 802 can be sacrificial regions such as scribe lines. In some embodiments, sacrificial regions may be within dies 802 and surrounding the device region. In some embodiments, any suitable number of counter-stress structures can be implemented in the sacrificial regions.

For example, FIG. 8 illustrates a single counter-stress structure 804 formed between adjacent dies 802 and extending in the x-direction for reducing wafer stress generated along the y-direction. In some embodiments, more than one counter-stress structure 804 can be formed in the scribe line. Counter-stress structures 804 can reduce wafer tensile or compressive stress along the y-direction. For example, structures formed in the semiconductor wafer causes tensile stress (e.g., as schematically illustrated as tensile stress 803) that expands the semiconductor wafer in the y-direction. Counter-stress structures 804 formed along the x-direction can be formed using one or more high-stress materials that provide compressive stress (e.g., as schematically illustrated as compressive stress 805) along the y-direction that can counter tensile stress 803 and result in reduced overall stress in the semiconductor wafer. Similarly, structures formed in the semiconductor wafer can cause compressive stress (e.g., as schematically illustrated as compressive stress 806) that compresses the semiconductor wafer in the y-direction. Counter-stress structures 807 formed along the x-direction can be formed using one or more high-stress materials that provide tensile stress (e.g., as schematically illustrated as tensile stress 807) substantially along the y-direction that can counter tensile stress 803 and result in reduced overall stress in the semiconductor wafer.

FIG. 9 illustrates counter-stress structures 808 formed in scribe lines between adjacent dies 802 and extending in the y-direction. Functioning in a similar fashion as counter-stress structures 804 described in FIG. 8, counter-stress structures 808 can reduce wafer compressive or tensile stress. Counter-stress structures 808 can be extending in the y-direction and substantially reduce stress in the x-direction. For example, counter-stress structure 808 can be formed using high-stress material providing compressive or tensile stress to reduce tensile or compressive stress, respectively, in the x-direction.

FIG. 10 illustrates counter-stress structures 810x and 810y formed in scribe lines between adjacent dies 802 for substantially reducing wafer stress in the x-direction and y-direction, respectively. In some embodiments, counter-stress structures 810x can be formed using high-stress material and are similar to counter-stress structures 808 described in FIG. 9. In some embodiments, counter-stress structures 810y can be formed using high-stress material and are similar to counter-stress structures 804 described in FIG. 8.

Figure 11:
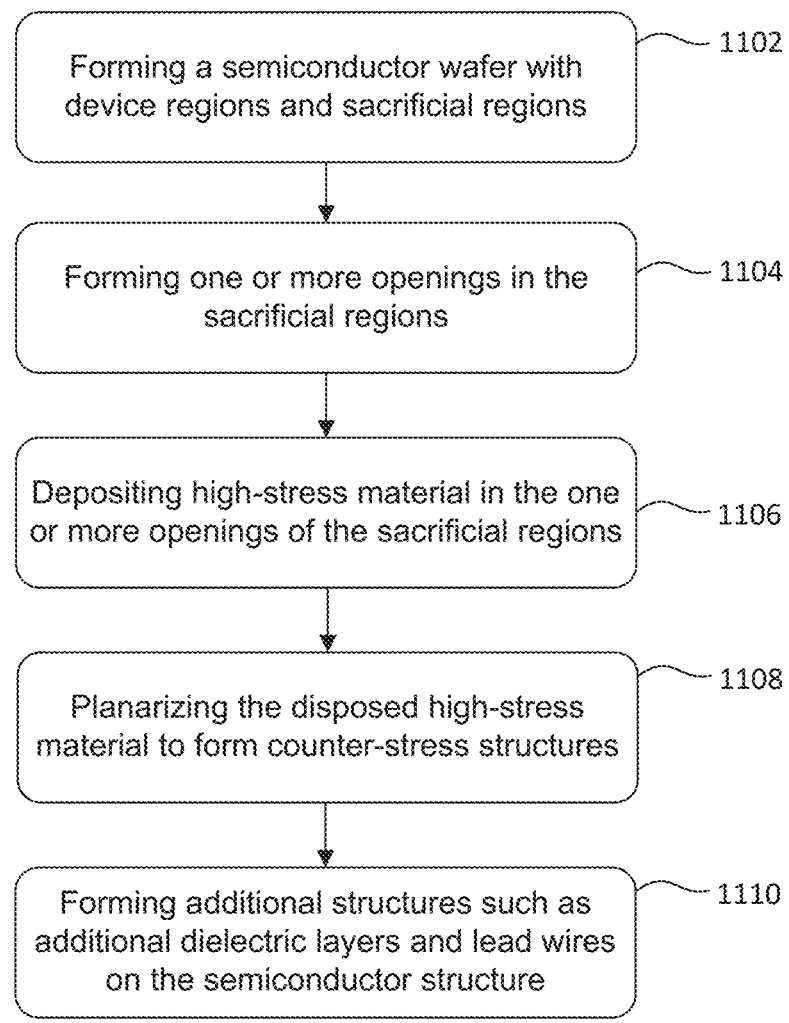
FIG. 11 is a flow diagram illustrating exemplary methods for forming counter-stress structures in sacrificial regions of a semiconductor wafer, in accordance with some embodiments of the present disclosure.

FIG. 11 is a flow diagram of an exemplary method 1100 of forming counter-stress materials in semiconductor wafers, in accordance with some embodiments of the present disclosure. This disclosure is not limited to this operational description of method 1100. Rather, other operations are within the spirit and scope of the present disclosure. It is to be appreciated that additional operations may be performed. Moreover, not all operations may be needed to perform the disclosure provided herein. Further, some of the operations may be performed simultaneously, or in a different order than shown in FIG. 11. In some implementations, one or more other operations may be performed in addition to or in place of the presently described operations. For illustrative purposes, method 1100 is described to form counter-stress structures illustrated in FIGS. 1-10, however, method 1100 is not limited to these embodiments.

At operation 1102, a semiconductor wafer having device regions and sacrificial regions is formed, in accordance with some embodiments. An example of device regions on a semiconductor wafer can be a region on a substrate that includes 3D NAND memory structure. Device regions can include a staircase region, an active device region, and a peripheral device region, such as staircase region 210, active device region 220, and peripheral device region 230, respectively, in FIG. 2. The substrate can include silicon, silicon germanium, silicon carbide, SOI, GOI, glass, gallium nitride, gallium arsenide, any suitable III-V compound material, and/or combinations thereof. An example of the substrate can be substrate 202 in FIG. 2. The dielectric layer can be formed using silicon oxide, silicon nitride, silicon oxynitride, and/or other suitable dielectric materials. A plurality of conductor layer and dielectric layer pairs are formed in a staircase region and an active device region of the 3D NAND memory structure. In some embodiments, the alternating conductor/dielectric stack includes more conductor layers or more dielectric layers with different materials and/or thicknesses than the conductor/dielectric layer pair. The conductor layers can include, W, Co, Cu, Al, doped silicon, silicides, or any combination thereof. The dielectric layers can include silicon oxide, silicon nitride, silicon oxynitride, or any combination thereof. 3D NAND memory device further includes NAND strings formed in the active device region and include a plurality of control gates. A peripheral device region can include a plurality of peripheral devices formed on the substrate. The peripheral devices can include a plurality of transistors formed on the substrate. Isolation regions and doped regions can also be formed in the substrate. Sacrificial regions can be formed adjacent to the device regions. In some embodiments, sacrificial regions can be a scribe line between each die of an array of dies for allowing a dicing saw to cut through and separate the dies. Examples of sacrificial regions can be sacrificial regions 250 described in FIG. 2.

At operation 1104, one or more openings are formed in sacrificial regions, in accordance with some embodiments. In some embodiments, openings are also formed in device regions, for example, one or more vias are formed in the staircase region, the active device region, and the peripheral device region. In some embodiments, the one or more openings in the sacrificial regions can extend through the dielectric layer and into the substrate. In some embodiments, the one or more openings in the sacrificial regions can have a trapezoidal cross-sectional shape with a wider top portion and a narrower bottom portion. In some embodiments, the one or more openings in the sacrificial regions can have a trapezoidal cross-sectional shape with a narrower top portion and a wider bottom portion. Examples of forming one or more openings in the sacrificial regions can be the processes used to form openings 252 in FIG. 2.

At operation 1106, high-stress material is disposed in the one or more openings in the sacrificial regions, in accordance with some embodiments. In some embodiments, high-stress material with compressive stress can be disposed to reduce tensile stress in the semiconductor wafer. In some embodiments, high-stress material with tensile stress can be disposed to reduce compressive stress in the semiconductor wafer. High-stress material can be disposed into the one or more openings in the sacrificial regions and also the openings in the device region. The deposition processes can include any suitable methods such as CVD, PVD, PECVD, sputtering, MOCVD, ALD, and/or combinations thereof. The high-stress material can be disposed until the one or more openings are completely filled with high-stress material. In some embodiments, the high-stress material is also an electrically conductive material that can also provide electrical connectivity. For example, the high-stress material can be tungsten. In some embodiments, the high-stress material can overflow onto a top surface of the dielectric layer. Examples of high-stress material disposed in the openings can be high-stress material 310 described in FIG. 3.

At operation 1108, the disposed high-stress material is planarized to form counter-stress structures, in accordance with some embodiments. A planarization process can be used to remove excessive disposed high-stress material from a top surface of the dielectric layer such that top surfaces of the high-stress material filled in the openings of device regions and sacrificial regions are substantially level with the top surface of the dielectric layer. In some embodiments, the planarization process can be a chemical mechanical polishing process. After the planarization process, conductive structures are formed in the openings of the device region and counter-stress structures are formed in the sacrificial region. Examples of conductive structures can be conductive structures 412 and conductive structures 432 described in FIG. 4. In some embodiments, the conductive structures can be contact wires and referred to as word line contacts. Examples of counter-stress structures can be counter-stress structures 452 formed in the sacrificial region after the planarization process. Examples of counter-stress structures can also be counter-stress structures 652, 752, 804, 809, 810x, and 810y described in FIGS. 6-10.

At operation 1110, additional structures such as additional dielectric layers and lead wires are formed on the semiconductor structure, in accordance with some embodiments. For example, additional dielectric layers can be disposed on the planarized top surface of the dielectric layer that includes the counter-stress structures. The additional dielectric layer can also be disposed on top surfaces of the conductive structures and counter-stress structures. The additional dielectric layer can be formed using any suitable dielectric material such as, for example, silicon oxide, silicon nitride, silicon oxynitride, and/or other suitable dielectric materials. The deposition of additional dielectric layer can include any suitable methods such as CVD, PVD, PECVD, sputtering, MOCVD, ALD, and/or combinations thereof.

Various embodiments described herein are directed to counter-stress structures of a 3D NAND memory device and fabricating methods of the same. The exemplary fabrication method includes forming openings in sacrificial regions of a semiconductor wafer. In some embodiments, the semiconductor wafer contains an array of 3D NAND memory devices and the sacrificial regions are scribe lines between the 3D NAND memory devices. High stress material is disposed in the openings and used to counter the stress formed by other structures on the semiconductor wafer. In some embodiments, forming the openings and depositing high stress material can be performed concurrently with forming openings for peripheral circuitry and depositing conductive material in the peripheral circuit openings, respectively, providing the benefit of no additional masks or processes steps. In some embodiments, the counter-stress structures can be trenches filled with high-stress material and formed in sacrificial regions such as scribe lines that are located between adjacent active regions of the semiconductor wafer. In some embodiments, the counter-stress structures can be formed along the x-direction or the y-direction. In some embodiments, the dimension and density of counter-stress structures can be determined by the stress level of the semiconductor wafer. Counter-stress structures can provide benefits such as, among other things, reduced stress in 3D NAND memory devices without occupying device space, no additional masks or processing steps, and wide range of suitable high-stress materials. Therefore, counter-stress structures can reduce stress in semiconductor wafers, which in turn ensures and improves the performance and yield of the 3D NAND memory devices.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A semiconductor wafer comprising:
   a substrate and a dielectric layer disposed on the substrate;
   first and second device regions disposed in the dielectric layer, wherein each of the first and second device regions comprises at least one semiconductor device; and
   a scribe line between the first and second device regions and extending in a lateral direction, wherein the scribe line comprises a plurality of counter-stress structures configured to counteract wafer stress formed in the first and second device regions, wherein the wafer stress formed in the first and second device regions is tensile and the plurality of counter-stress structures is configured to produce compressive stress.

2. The semiconductor wafer of claim 1, wherein the plurality of counter-stress structures comprises a high-stress material.

3. The semiconductor wafer of claim 1, wherein the plurality of counter-stress structures comprises trenches filled with tungsten.

4. The semiconductor wafer of claim 1, wherein the plurality of counter-stress structures is disposed in the dielectric layer and extends into the substrate.

5. The semiconductor wafer of claim 1, further comprising a further scribe line extending in a further direction perpendicular to the lateral direction, wherein the further scribe line comprises a further plurality of counter-stress structures.

6. The semiconductor wafer of claim 5, wherein:
the plurality of counter-stress structures is configured to counteract the wafer stress that is formed along the further direction; and
the further plurality of counter-stress structures is configured to counteract the wafer stress that is formed along the lateral direction.

7. The semiconductor wafer of claim 1, wherein the scribe line is configured to physically separate the first and second device regions.

8. The semiconductor wafer of claim 1, wherein the first and second device regions comprise three-dimensional (3D) memory structures.

9. The semiconductor wafer of claim 1, wherein the scribe line is located in a sacrificial region of the semiconductor wafer.

10. The semiconductor wafer of claim 1, further comprising an another dielectric layer disposed on top surfaces of the plurality of counter-stress structures.

11. A semiconductor wafer comprising:
an array of dies, wherein each die of the array of dies comprises a first type of wafer stress, wherein the first type of wafer stress comprises tensile stress;
first and second pluralities of scribe lines extending in first and second directions, respectively, wherein each scribe line of the first and second pluralities of scribe lines is disposed between adjacent dies of the array of dies; and
first and second pluralities of semiconductor structures formed in the first and second pluralities of scribe lines, respectively, wherein each semiconductor structure comprises a high-stress material that produces a second type of wafer stress to counteract the first type of wafer stress, wherein the second type of wafer stress comprises compressive stress.

12. The semiconductor wafer of claim 11, wherein:
the first plurality of semiconductor structures is configured to counteract the first type of wafer stress formed along the second direction; and
the second plurality of semiconductor structures is configured to counteract the first type of wafer stress formed along the first direction.

13. The semiconductor wafer of claim 11, wherein the high-stress material comprises tungsten.

14. The semiconductor wafer of claim 11, wherein each die of the array of dies comprises a three-dimensional (3D) memory structure.

15. The semiconductor wafer of claim 11, wherein a semiconductor structure of the first plurality of semiconductor structures or the second plurality of semiconductor structures comprises a trapezoidal cross-sectional shape.

16. A method for forming a semiconductor wafer, the method comprising:
forming a plurality of semiconductor structures in each device region of an array of device regions, wherein the plurality of semiconductor structures produces a first type of wafer stress in the semiconductor wafer, and wherein the first type of wafer stress comprises tensile stress;
forming a plurality of openings in a plurality of scribe lines, wherein each scribe line is disposed between a pair of device regions of the array of the device regions; and
disposing a high-stress material in the plurality of openings to form first and second pluralities of counter-stress structures that produce a second type of wafer stress to counteract the first type of wafer stress, wherein the second type of wafer stress comprises compressive stress.

17. The method of claim 16, wherein disposing the high-stress material comprises disposing tungsten.

18. The method of claim 16, further comprising performing a dicing process along the plurality of scribe lines to physically separate each device region of the array of device regions.

19. The method of claim 16, wherein:
the first plurality of counter-stress structures extend in a first lateral direction and counteracts the first type of wafer stress that is formed along a second lateral direction perpendicular to the first lateral direction; and
the second plurality of counter-stress structures extend in the second lateral direction and counteracts the first type of wafer stress that is formed along the first lateral direction.

20. The method of claim 16, further comprising forming a plurality of three-dimensional (3D) memory structures in the array of device regions.

* * * * *